United States Patent
Wang et al.

(10) Patent No.: US 8,605,915 B2
(45) Date of Patent: Dec. 10, 2013

(54) CLASS G AUDIO AMPLIFIERS AND ASSOCIATED METHODS OF OPERATION

(75) Inventors: Haishi Wang, Chengdu (CN); Zhengwei Zhang, Chengdu (CN); Rui Wang, Chengdu (CN); Jinyan Lin, Hangzhou (CN)

(73) Assignee: Monolithic Power Systems, Inc., San Jose, CA (US)

( * ) Notice: Subject to any disclaimer, the term of this patent is extended or adjusted under 35 U.S.C. 154(b) by 571 days.

(21) Appl. No.: 12/908,748

(22) Filed: Oct. 20, 2010

(65) Prior Publication Data
US 2011/0123048 A1     May 26, 2011

(30) Foreign Application Priority Data
Oct. 20, 2009   (CN) .......................... 2009 1 0308523

(51) Int. Cl.
*H04R 5/00*      (2006.01)
*H03F 3/04*      (2006.01)

(52) U.S. Cl.
USPC ............................................. 381/28; 330/297

(58) Field of Classification Search
USPC ............... 330/297, 296, 285; 381/28, 57, 102
See application file for complete search history.

(56) References Cited

U.S. PATENT DOCUMENTS

| | | | |
|---|---|---|---|
| 7,808,324 B1 * | 10/2010 | Woodford et al. ............. | 330/297 |
| 2010/0219888 A1 * | 9/2010 | Lesso ............................ | 330/136 |
| 2011/0095829 A1 * | 4/2011 | Ye et al. ........................ | 330/297 |
| 2011/0221533 A1 * | 9/2011 | Lesso ............................ | 330/297 |

* cited by examiner

*Primary Examiner* — Fan Tsang
*Assistant Examiner* — Eugene Zhao
(74) *Attorney, Agent, or Firm* — Perkins Coie LLP

(57) ABSTRACT

The present technology is directed to class G audio amplifiers and the associated methods of operation. In one embodiment, a class G audio amplifier includes an input port, an audio output stage, a level detector, and a charge pump. The class G audio amplifier regulates the power supplies of the audio output stage according to the input signal, so as to realize high efficiency and high quality audio output.

15 Claims, 9 Drawing Sheets

CLASS G AUDIO AMPLIFIERS AND ASSOCIATED METHODS OF OPERATION

CROSS-REFERENCE TO RELATED APPLICATION(S)

The present application claims priority to Chinese Patent Application No. 200910308523.1, filed Oct. 20, 2009, which is incorporated herein by reference in its entirety.

TECHNICAL FIELD

The present application relates generally to class G audio amplifier circuits and associated methods of operation.

BACKGROUND

Class AB amplifiers typically have good output, but low efficiencies. In order to improve efficiency and maintain good output, class G amplifier was introduced. The operation principle of class G amplifiers is similar to class AB amplifiers. In contrast to class AB amplifiers, the power supply of class G amplifiers is variable as the input signal varies, so that a voltage across the audio output stage is low to increase the efficiency.

FIG. 1 illustrates a prior art single-supply class AB amplifier 10. As shown in FIG. 1, the single-supply class AB amplifier 10 comprises audio output stages 11 and 12, both of which are powered by a positive power supply ($V_{DD}$); speakers 13, 14, and blocking capacitors 15, 16. The blocking capacitors 15, 16 are used to block a DC bias. Typically, the DC bias is about $0.5V_{DD}$. So the capacitance of the blocking capacitors 15, 16 are large, e.g. 470 µF. The high capacitance of may interfere with external circuit, enlarge the size of the amplifier, and increase costs of manufacturing.

FIG. 2 illustrates a prior art amplifier circuit 20 that adopts a charge pump to power audio output stages. In contrast to the single-supply class AB amplifier 10 shown in FIG. 1, the amplifier circuit 20 comprises a charge pump that provides a negative power supply ($V_{SS}$) to power output stages 11, 12. The negative power supply ($V_{SS}$) has the same amplitude as the positive power supply ($V_{DD}$), but with a different polarity. As a result, the amplifier circuit 20 does not require a high capacitance blocking capacitor. Instead, the amplifier circuit 20 includes a capacitor 21 and a fly capacitor 22 with low capacitance, e.g. 1 µF. However, when the input signal is small, the loss of the amplifier circuit 20 is high, causing low efficiencies.

FIG. 3 illustrates a prior art amplifier circuit 30 that uses two power supplies. As shown in FIG. 3, a positive power supply ($HPV_{DD}$) is provided by a buck converter including a high-side switch 38, a low-side switch 39, an inductor 40, and an output capacitor 41. The duty cycles of the high-side switch 38 and the low-side switch 39 are regulated as the input signal varies through a level detector 31, an optimizer 32, an error amplifier 33, a compensation network 34, a saw-tooth wave generator 35, a PWM (pulse width modulation) comparator 36, and a driving circuit 37, so that the positive power supply ($HPV_{DD}$) is regulated.

A charge pump 43 receives the positive power supply ($HPV_{DD}$), and provides a negative power supply ($HPV_{SS}$) which has the same amplitude to the positive power supply ($HPV_{DD}$). The positive power supply ($HPV_{DD}$) and the negative power supply ($HPV_{SS}$) are used to power an audio output stage 42 of the amplifier circuit 30. Both power supplies of the audio output stage 42 vary as the input signal varies, reducing loss and increasing efficiency. However, the buck converter requires a large layout, even larger than a Class AB amplifier with a charge pump. The buck converter also has low efficiencies under light load. Thus, an additional inductor 40 is needed, which can increase costs and generate EMI (Electro Magnetic Interference). Accordingly, there is a need for improved class G audio amplifiers with high efficiency, small size, and low cost.

DETAILED DESCRIPTION

Embodiments of class G audio amplifiers and associated methods of operation are described in detail herein. In the following description, some specific details, such as example circuits components, are included to provide a thorough understanding of embodiments of the technology. One skilled in relevant art will recognize, however, that the technology can be practiced without one or more specific details, or with other methods, components, materials, etc.

In one embodiment, a class G audio amplifier includes an input port for receiving an input signal; an audio output stage coupled to the input port for providing an amplified audio signal; a level detector coupled to the input port for detecting the input signal, and providing a level detected signal based on the detecting; a charge pump coupled to the level detector for providing a positive power supply and a negative power supply in response to the level detected signal. The positive power supply and the negative power supply are used to power the audio output stage.

In another embodiment, a method for operating a class G audio amplifier includes detecting an input signal to get a level detected signal; providing a positive power supply and a negative power supply in response to the level detected signal; and providing an amplified audio signal in response to the input signal, the positive power supply, and the negative power supply.

Figure 1:
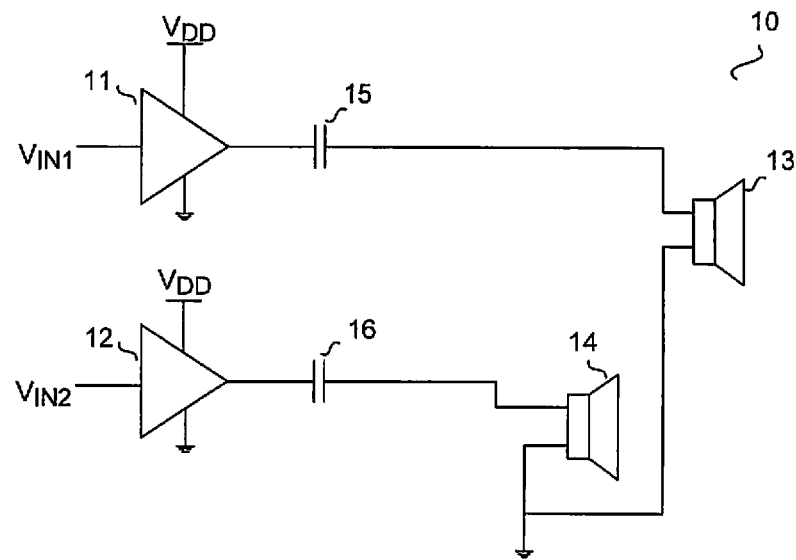
FIG. 1 illustrates a schematic circuit of a single-supply class AB audio amplifier in accordance with the prior art.
Figure 2:
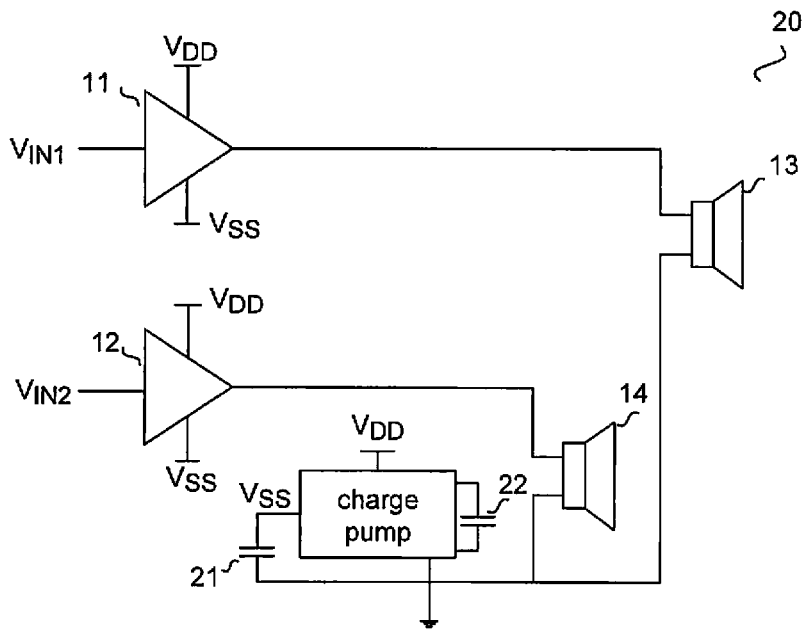
FIG. 2 illustrates a schematic circuit of an amplifier circuit with a charge pump to power audio output stages in accordance with the prior art.
Figure 3:
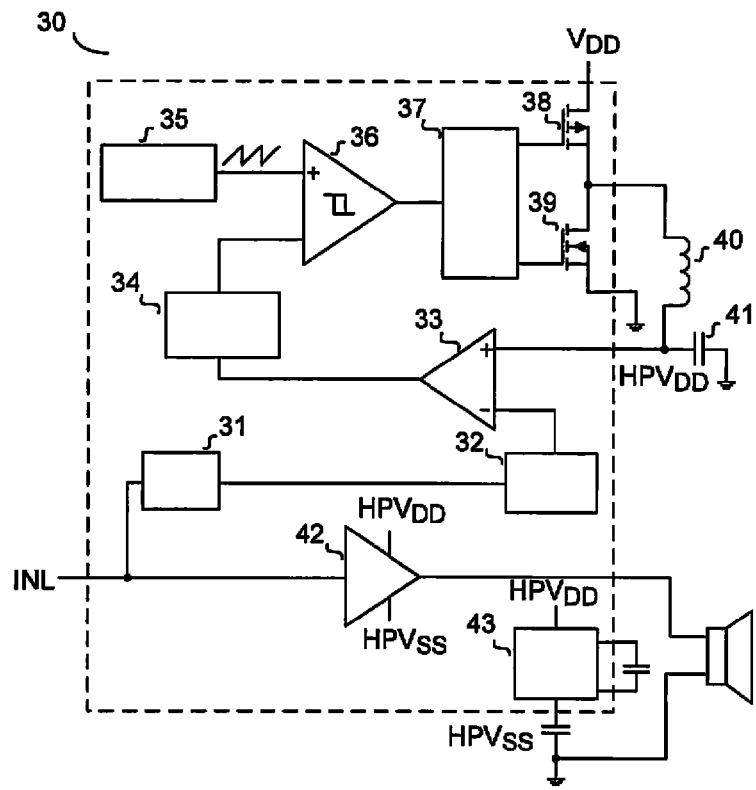
FIG. 3 illustrates a schematic circuit of an amplifier circuit with two power supplies in accordance with the prior art.
Figure 4:
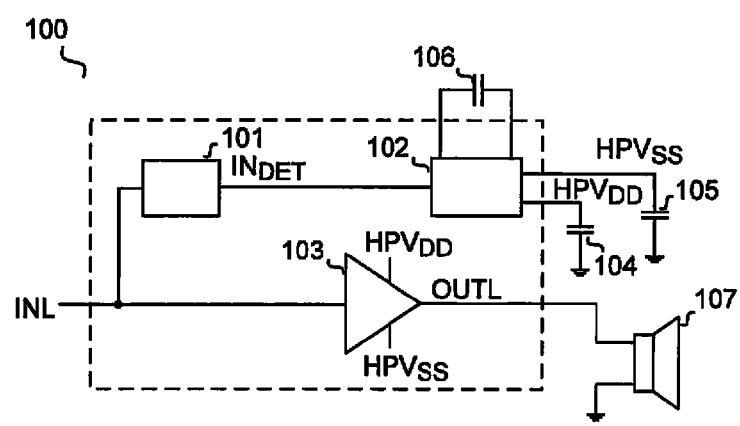
FIG. 4 illustrates a schematic circuit of a class G audio amplifier in accordance with embodiments of the technology.

FIG. 4 illustrates a schematic circuit of a class G audio amplifier 100 in accordance with embodiments of the technology. As shown in FIG. 4, the class G audio amplifier 100 includes an input port for receiving an input signal (INL); an audio output stage 103 coupled to the input port to receive the input signal (INL) and configured to provide an amplified audio signal (OUTL) to a speaker 107. A level detector 101 is coupled to the input port for detecting the input signal (INL), and provides a level detected signal ($IN_{DET}$) based thereupon.

A charge pump 102 is coupled to the output of the level detector 101 for receiving the level detected signal ($IN_{DET}$), and provides a positive power supply ($HPV_{DD}$) and a negative power supply ($HPV_{SS}$) based thereupon. In one embodiment, the positive power supply ($HPV_{DD}$) and the negative power supply ($HPV_{SS}$) provided by the charge pump 102 are with the same amplitudes but opposite polarities from each other. Both positive power supply ($HPV_{DD}$) and the negative power supply ($HPV_{SS}$) are used to power the audio output stage 103. In other embodiments, the positive power supply ($HPV_{DD}$) and the negative power supply ($HPV_{SS}$) may have different amplitudes.

Figure 5:
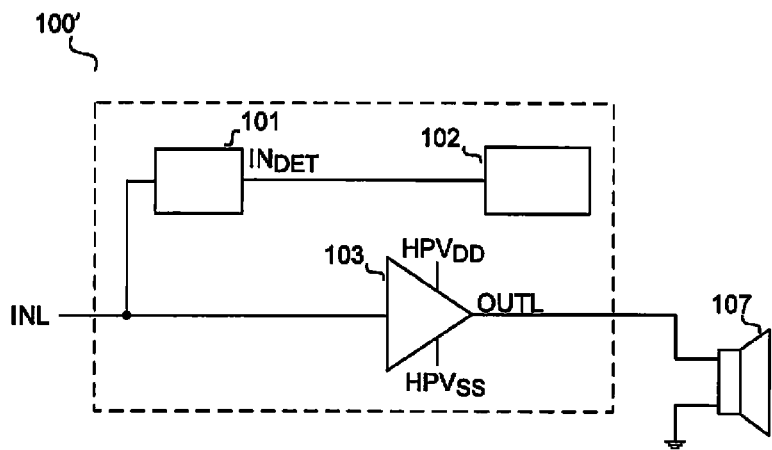
FIG. 5 illustrates a schematic circuit of a class G audio amplifier in accordance with embodiments of the technology.

In one embodiment, the class G audio amplifier 100 further comprises a positive power capacitor 104 connected between a positive output of the charge pump 102 and ground. A negative power capacitor 105 is connected between a negative output of the charge pump 102 and ground. A fly capacitor 106 is coupled to the charge pump 102. Thus, the positive power capacitor 104, the negative power capacitor 105, and the fly capacitor 106 are formed independent of the charge pump 102. In other embodiments, the positive power capacitor 104, the negative power capacitor 105, and the fly capacitor 106 may be integrated into the charge pump 102, as shown in the class G audio amplifier 100' of FIG. 5. The operation principles of class G audio amplifiers 100 and 100' are generally similar. Thus, the following description is based on the class G audio amplifier 100 in FIG. 4 for brevity, though it equally applied to the class G audio amplifier 100' of FIG. 5.

In operation, the level detector 101 detects the magnitude of the input signal (INL) and provides a level detected signal to the charge pump 102. The charge pump 102 receives the level detected signal and provides the positive power supply ($HPV_{DD}$) and the negative power supply ($HPV_{SS}$) based thereupon, so that the power supplies of the audio output stage 103 varies according to the variation of the input signal (INL).

Figure 6A:
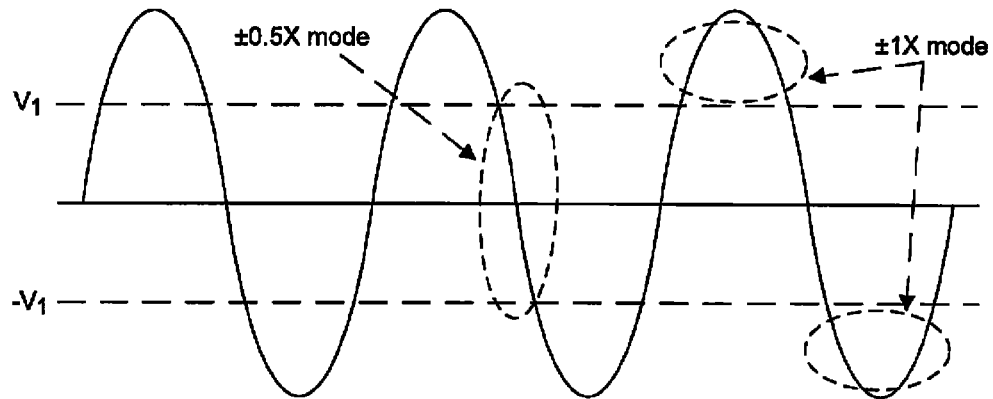
FIG. 6A illustrates a schematic work mode of the class G audio amplifier in FIG. 4.

FIG. 6A illustrates a schematic work mode of the class G audio amplifier 100 in FIG. 4. In one embodiment, the class G audio amplifier 100 regulates the amplified audio signal according to the instantaneous value of the input signal (INL). When the instantaneous value of the input signal (INL) is lower than a first preset value ($V_1$), the charge pump 102 operates at ±0.5× mode, i.e., $HPV_{DD}=0.5V_{DD}$, $HPV_{SS}=-0.5V_{DD}$. As a result, the voltage across the audio output stage 103 decreases. When the instantaneous value of the input signal (INL) is higher than the first preset value ($V_1$), the charge pump 102 operates at ±1× mode, i.e., $HPV_{DD}=V_{DD}$, $HPV_{SS}=-V_{DD}$. As a result, the audio output stage 103 provides the amplified audio signal with essentially no distortion.

Figure 6B:
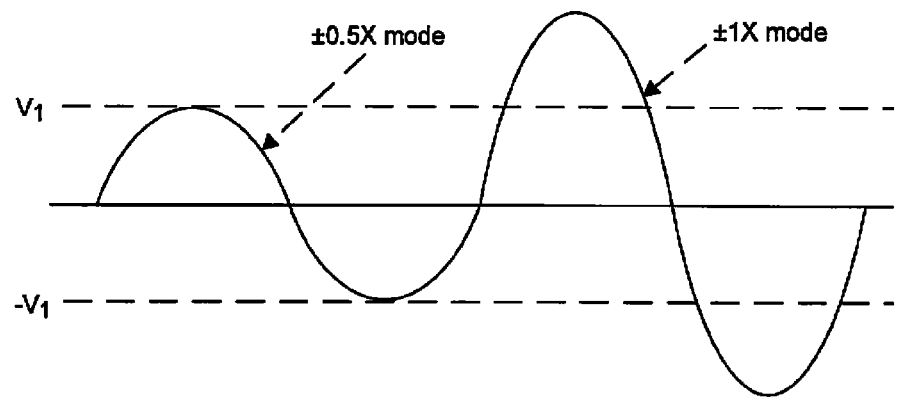
FIG. 6B illustrates another schematic work mode of the class G audio amplifier in FIG. 4.

FIG. 6B illustrates another schematic work mode of the class G audio amplifier 100 in FIG. 4. In one embodiment, the class G audio amplifier 100 regulates the amplified audio signal according to the amplitude of the input signal (INL). When the amplitude of the input signal (INL) is lower than the first preset value ($V_1$), the charge pump 102 operates at ±0.5× mode, i.e., $HPV_{DD}=0.5V_{DD}$, $HPV_{SS}=-0.5V_{DD}$. As a result, the voltage across the audio output stage 103 decreases. When the amplitude of the input signal (INL) is higher than the first preset value ($V_1$), the charge pump 102 operates at ±1× mode, i.e., $HPV_{DD}=V_{DD}$, $HPV_{SS}=-V_{DD}$. As a result, the audio output stage 103 provides the amplified audio signal with essentially no distortion.

In certain embodiments, during a transition from ±1× mode to ±0.5× mode, if $HPV_{DD}>0.5V_{DD}$, $HPV_{SS}>-0.5V_{DD}$, the charge pump 102 may be idle and is set into a sleep mode. In other embodiments, the charge pump 102 may be have other suitable operations.

Figure 7:
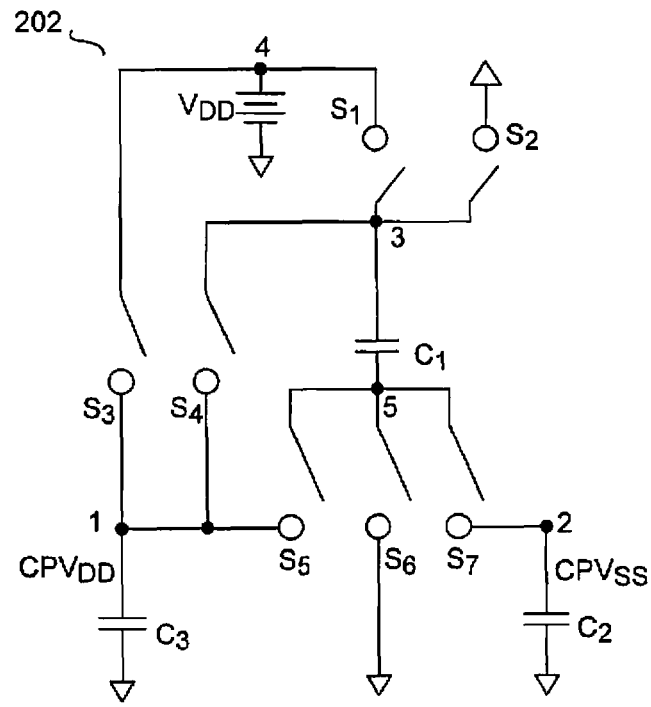
FIG. 7 illustrates a schematic circuit of a charge pump used in a class G audio amplifier in accordance with embodiments of the technology.

FIG. 7 illustrates a schematic circuit of a charge pump 202 suitable for a class G audio amplifier in accordance with additional embodiments of the technology. As shown in FIG. 7, the charge pump 202 comprises 7 switches (identified individually as switches $S_1$~$S_7$), a fly capacitor ($C_1$), a negative power capacitor ($C_2$), a positive power capacitor ($C_3$), a power supply ($V_{DD}$), and nodes 1~5. In one embodiment, the positive power capacitor ($C_3$) is connected between a positive output of the charge pump 202 and ground. The negative power capacitor ($C_2$) is connected between a negative output of the charge pump 102 and ground. The first terminal of the fly capacitor is coupled to the power supply ($V_{DD}$), and the second terminal of the fly capacitor is controllably coupled to the positive output or the negative output of the charge pump 202. In one embodiment, switches ($S_1$~$S_7$) may be MOSFETs. However, in other embodiments, the switches may be IGBT, JFET, and/or other suitable controllable switch devices.

In one embodiment, the first switch ($S_1$) is coupled between node 3 and node 4; the second switch ($S_2$) is coupled between node 3 and ground; the third switch ($S_3$) is coupled between node 1 and node 4; the fourth switch ($S_4$) is coupled between node 1 and node 3; the fifth switch ($S_5$) is coupled between node 1 and node 5; the sixth switch ($S_6$) is coupled between node 5 and ground; the seventh switch ($S_7$) is coupled between node 2 and node 5; the fly capacitor ($C_1$) is coupled between node 3 and node 5; the negative power capacitor ($C_2$) is coupled between node 2 and ground; the positive power capacitor ($C_3$) is coupled between node 1 and ground; the power supply ($V_{DD}$) is coupled between node 4 and ground. In certain embodiments, node 1 is the positive output of the charge pump 202, node 2 is the negative output of the charge pump 202. In other embodiments, different power supplies may be provided when different control schemes are adopted.

Figure 8:
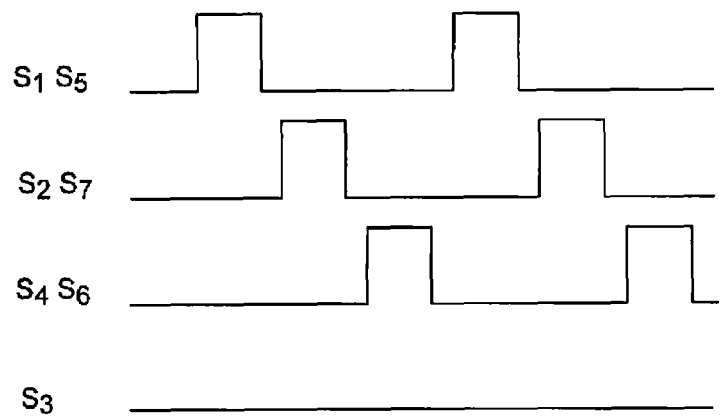
FIG. 8 illustrates switch control signals when the charge pump in FIG. 7 operates under ±0.5× mode.

FIG. 8 illustrates switch control signals when the charge pump 202 in FIG. 7 operates under ±0.5× mode. As shown in FIG. 8, the control signals of the first switch ($S_1$) to the seventh switch ($S_7$) are as follows: Operation 1, turn on the first switch ($S_1$) and the fifth switch ($S_5$), and turn off the rest of the switches. The power supply ($V_{DD}$), the first switch ($S_1$), the fly capacitor ($C_1$), the fifth switch ($S_5$), and the positive power capacitor ($C_3$) form a current loop. The voltage across the fly capacitor ($C_1$) is charged to be $V_{C1}$, the voltage across the positive power capacitor ($C_3$) is charged to be $V_{C3}$, wherein $V_{C1}+V_{C3}=V_{DD}$. And the voltage across the positive power capacitor ($C_3$) is positive, i.e., $HPV_{DD}=+V_{C3}$.

Operation 2, turn on the second switch ($S_2$) and the seventh switch ($S_7$), and turn off the rest of the switches. The second switch ($S_2$), the fly capacitor ($C_1$), the seventh switch ($S_7$), and the negative power capacitor ($C_2$) form a current loop. The fly capacitor ($C_1$) and the negative power capacitor ($C_2$) are coupled in parallel. The fly capacitor ($C_1$) is discharged by the negative capacitor ($C_2$). Accordingly, the voltage across the negative power capacitor ($C_2$) is $V_{C2}=V_{C1}$. The voltage across the negative capacitor ($C_2$) is negative, i.e., $HPV_{SS}=-V_{C1}$.

Operation 3, turn on the fourth switch ($S_4$) and the sixth switch ($S_6$), and turn off the rest of the switches. The sixth switch ($S_6$), the fly capacitor ($C_1$), the fourth switch ($S_4$), and the positive power capacitor ($C_3$) form a current loop. The fly capacitor ($C_1$) and the positive power capacitor ($C_3$) are coupled in parallel. Accordingly, the voltage across the fly capacitor ($C_1$) is equal to the voltage across the positive power capacitor ($C_3$), i.e., $V_{C1}=V_{C3}$. As illustrated above, $V_{C1}+V_{C3}=V_{DD}$, so $V_{C1}=V_{C3}=0.5V_{DD}$, $HPV_{DD}=V_{C3}=+0.5V_{DD}$, $HPV_{SS}=-V_{C1}=-0.5V_{DD}$. The process repeats by executing above three operation to provide stable $HPV_{DD}=+0.5V_{DD}$, $HPV_{SS}=-0.5V_{DD}$, realizing the ±0.5× mode.

Figure 9:
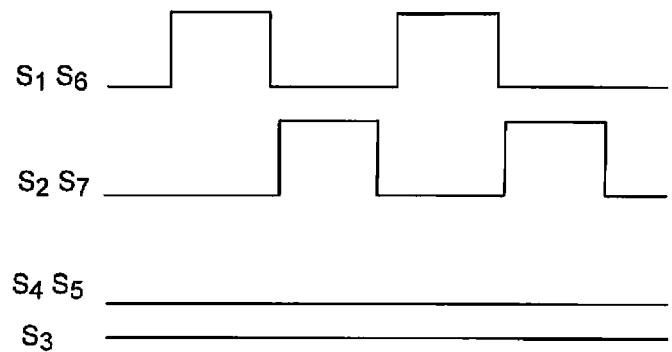
FIG. 9 illustrates switch control signals when the charge pump in FIG. 7 operates under ±1× mode.

FIG. 9 illustrates switch control signals when the charge pump 202 in FIG. 7 operates under ±1× mode. As shown in FIG. 9, the control signals of the first switch ($S_1$) to the seventh switch ($S_7$) are as follows: Operation 1, turn on the first switch ($S_1$), the third switch ($S_3$) and the sixth switch ($S_6$), and turn off the rest of the switches. The power supply ($V_{DD}$), the first switch ($S_1$), the fly capacitor ($C_1$), and the sixth switch ($S_6$) form a current loop. Meanwhile, the power supply ($V_{DD}$), the third switch ($S_3$), and the positive power capacitor ($C_3$) also form a current loop. The voltage across the fly capacitor ($C_1$) and the voltage across the positive capacitor ($C_3$) are charged to be $V_{DD}$. And both voltages are positive, i.e., $HPV_{DD}=+V_{DD}$.

Operation 2, turn on the second switch ($S_2$) and the seventh switch ($S_7$), maintain the third switch ($S_3$) on, and turn off the rest of the switches. The second switch ($S_2$), the fly capacitor ($C_1$), the seventh switch ($S_7$), and the negative power capacitor ($C_2$) form a current loop. The fly capacitor ($C_1$) and the negative power capacitor ($C_2$) are coupled in parallel. The fly capacitor ($C_1$) is discharged by the negative capacitor ($C_2$). Accordingly, the voltage across the negative power capacitor ($C_2$) is $V_{C2}=V_{DD}$. And the voltage across the negative capacitor ($C_2$) is negative, i.e., $HPV_{SS}=-V_{DD}$. The process repeats by executing above two operations to provide stable $HPV_{DD}=+V_{DD}$, $HPV_{SS}=-V_{C0}$, realizing the ±1× mode.

Figure 10:
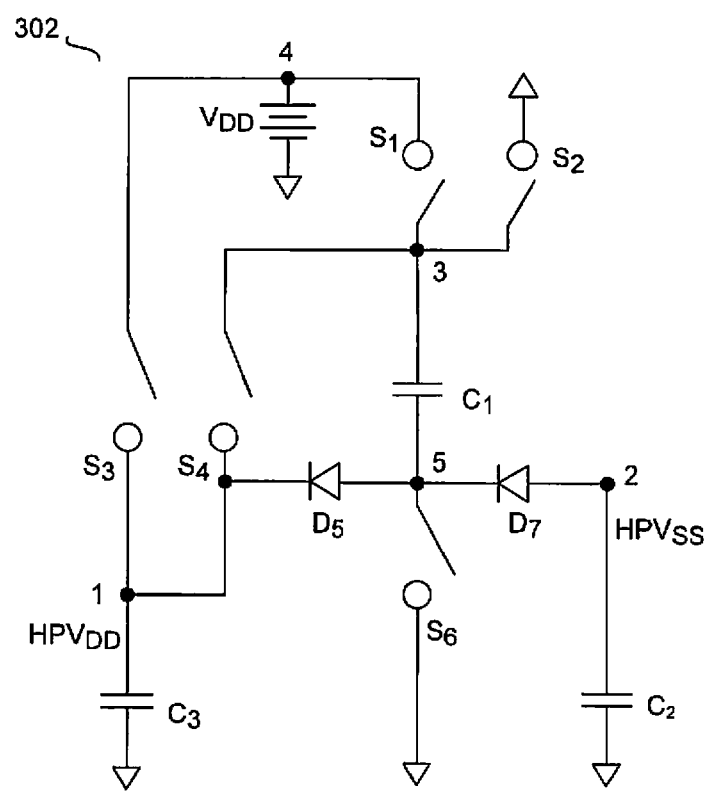
FIG. 10 illustrates a schematic circuit of a charge pump used in a class G audio amplifier in accordance with embodiments of the technology.

FIG. 10 illustrates a schematic circuit of a charge pump 302 suitable for a class G audio amplifier in accordance with additional embodiments of the technology. In contrast to the charge pump 202 in FIG. 7, the charge pump 302 includes a first diode ($D_5$) in place of the fifth switch ($S_5$), and a second diode ($D_7$) in place of the seventh switch ($S_7$). The rest of the charge pump 302 is generally similar to the charge pump 202.

Figure 11:
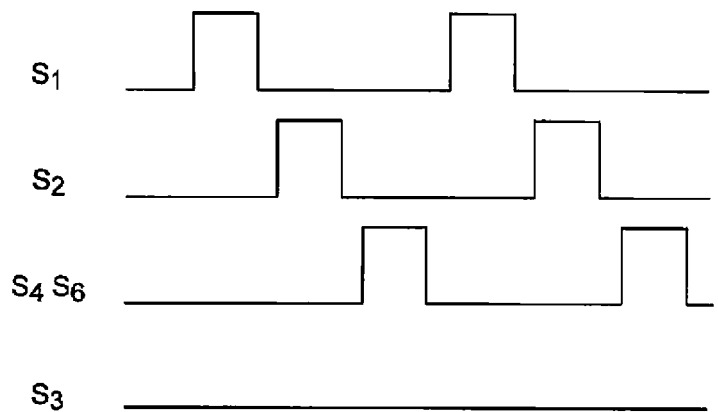
FIG. 11 illustrates switch control signals when the charge pump in FIG. 10 operates under ±0.5× mode.

FIG. 11 illustrates switch control signals when the charge pump 302 in FIG. 10 operates under ±0.5× mode. As shown in FIG. 11, the control signals of the first switch ($S_1$) to the sixth switch ($S_6$) are as follows: Operation 1, turn on the first switch ($S_1$), and turn off the rest of the switches. The power supply ($V_{DD}$), the first switch ($S_1$), the fly capacitor ($C_1$), the first diode ($D_5$), and the positive power capacitor ($C_3$) form a current loop. The voltage across the fly capacitor ($C_1$) is charged to be $V_{C1}$, the voltage across the positive power capacitor ($C_3$) is charged to be $V_{C3}$, wherein $V_{C1}+V_{C3}=V_{DD}$. And both voltage are positive, i.e., $HPV_{DD}=V_{C3}$.

Operation 2, turn on the second switch ($S_2$), and turn off the rest of the switches. The second switch ($S_2$), the fly capacitor ($C_1$), the second diode ($D_7$), and the negative power capacitor ($C_2$) form a current loop. The fly capacitor ($C_1$) and the negative power capacitor ($C_2$) are coupled in parallel. The fly capacitor ($C_1$) is discharged by the negative capacitor ($C_2$). Accordingly, the voltage across the negative power capacitor ($C_2$) is $V_{C2}=V_{C1}$. And the voltage across the negative capacitor ($C_2$) is negative, i.e., $HPV_{SS}=-V_{C1}$.

Operation 3, turn on the fourth switch ($S_4$) and the sixth switch ($S_6$), and turn off the rest of the switches. The sixth switch ($S_6$), the fly capacitor ($C_1$), the fourth switch ($S_4$), and the positive power capacitor ($C_3$) form a current loop. The fly capacitor ($C_1$) and the positive power capacitor ($C_3$) are coupled in parallel. Accordingly, the voltage across the fly capacitor ($C_1$) is equal to the voltage across the positive power capacitor ($C_3$), i.e., $V_{C1}=V_{C3}$. As illustrated above, $V_{C1}+V_{C3}=V_{DD}$, so $V_{C1}=V_{C3}=+0.5V_{DD}$, $HPV_{DD}=V_{C3}=+0.5V_{DD}$, $HPV_{SS}=-V_{C1}=-0.5V_{DD}$. The process repeats by executing above three operation to provide stable $HPV_{DD}=+0.5V_{DD}$, $HPV_{SS}=-0.5V_{DD}$, realizing the ±0.5× mode.

Figure 12:
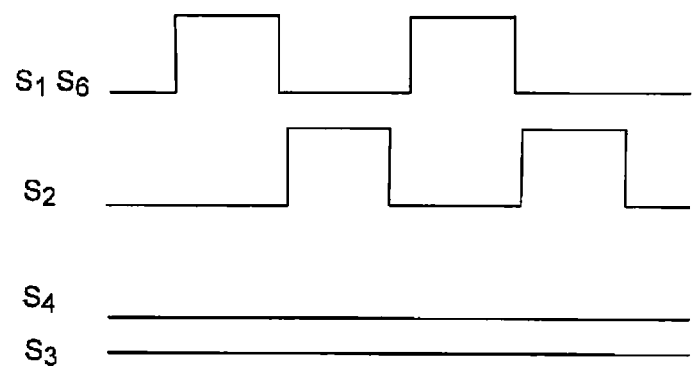
FIG. 12 illustrates switch control signals when the charge pump in FIG. 10 operates under ±1× mode.

FIG. 12 illustrates switch control signals when the charge pump 302 in FIG. 10 operates under ±1× mode. As shown in FIG. 12, the control signals of the first switch ($S_1$) to the sixth switch ($S_6$) are as follows: Operation 1, turn on the first switch ($S_1$), the third switch ($S_3$) and the sixth switch ($S_6$), and turn off the rest of the switches. The power supply ($V_{DD}$), the first switch ($S_1$), the fly capacitor ($C_1$), and the sixth switch ($S_6$) form a current loop. Meanwhile, the power supply ($V_{DD}$), the third switch ($S_3$), and the positive power capacitor ($C_3$) also form a current loop. The voltage across the fly capacitor ($C_1$) and the voltage across the positive capacitor ($C_3$) are both charged to be $V_{DD}$. And both voltages are positive, i.e., $HPV_{DD}=+V_{DD}$.

Operation 2, turn on the second switch ($S_2$), and keep the third switch ($S_3$) on, and turn off the rest of the switches. The second switch ($S_2$), the fly capacitor ($C_1$), the second diode ($D_7$), and the negative power capacitor ($C_2$) form a current loop. The fly capacitor ($C_1$) and the negative power capacitor ($C_2$) are coupled in parallel. The fly capacitor ($C_1$) is discharged by the negative capacitor ($C_2$). Accordingly, the voltage across the negative power capacitor ($C_2$) is $V_{C2}=V_{DD}$. And the voltage across the negative capacitor ($C_2$) is negative, i.e., $HPV_{SS}=-V_{DD}$. The process repeats by executing the two foregoing operations to provide stable $HPV_{DD}=+V_{DD}$, $HPV_{SS}=-V_{DD}$, realizing the ±1× mode.

As illustrated hereinbefore, the first switch ($S_1$) and the third switch ($S_3$) are operated in ON/OFF mode. However, that in other embodiment, the first switch ($S_1$) and the third switch ($S_3$) may operate as a controllable current source. For example, when the first switch ($S_1$) is turned on, the power supply ($V_{DD}$) and the first switch ($S_1$) are equivalent to a controllable current source, so that the voltage across the fly capacitor ($C_1$) increases slowly. When the first switch ($S_1$) is turned off, the power supply ($V_{DD}$) and the fly capacitor ($C_1$) are disconnected. Similarly, when the third switch ($S_3$) is turned on, the power supply ($V_{DD}$) and the third switch ($S_3$) are equivalent to a controllable current source, so that the voltage across the positive power capacitor ($C_3$) increases slowly. When the third switch ($S_3$) is turned off, the power supply ($V_{DD}$) and the positive power capacitor ($C_3$) are disconnected.

Furthermore, the class G audio amplifier in accordance with yet further embodiments of the technology may provide more than 2-level power supplies. For example, the class G audio amplifier may provide N-level power supplies, e.g., $\pm V_{DD}/N, \pm 2*V_{DD}/N, \pm 3*V_{DD}/N, \ldots, \pm(N-2)*V_{DD}/N, \pm(N-$ 1)*$V_{DD}$/N, ±$V_{DD}$, where N is a natural number. When N-level power supplies are used, the fly capacitor ($C_1$) is replaced by (N−1) capacitors coupled in series.

Figure 13:
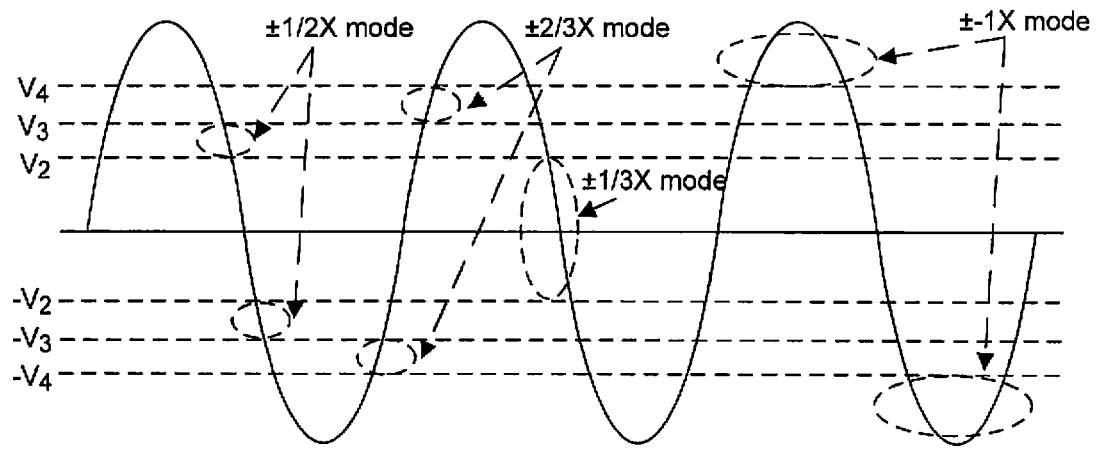
FIG. 13 illustrates a schematic output signal waveform of the class G audio amplifier in accordance with embodiments of the technology.

FIG. 13 illustrates a schematic output signal waveform of the class G audio amplifier 100 with N=3. In one embodiment, when the instantaneous value of the input signal (INL) is lower than a second preset value ($V_2$), the charge pump 102 operates at ±⅓× mode, i.e., $HPV_{DD}$=⅓$V_{DD}$, $HPV_{SS}$=−⅓$V_{DD}$. When the instantaneous value of the input signal (INL) is lower than the second preset value ($V_2$) but higher than a third preset value ($V_3$), the charge pump 102 operates at ±½× mode, i.e., $HPV_{DD}$=½$V_{DD}$, $HPV_{SS}$=−½$V_{DD}$. When the instantaneous value of the input signal (INL) is higher than the third preset value ($V_2$) but lower than a fourth preset value ($V_4$), the charge pump 102 operates at ±⅔× mode, i.e., $HPV_{DD}$=⅔$V_{DD}$, $HPV_{SS}$=−⅔$V_{DD}$. When the instantaneous value of the input signal (INL) is higher than the fourth preset value ($V_4$), the charge pump 102 operates at ±1× mode, i.e., $HPV_{DD}$=$V_{DD}$, $HPV_{SS}$=−$V_{DD}$.

In one embodiment, during a transition from a high mode to a low mode, e.g., from ±1× mode to ±0.5× mode, if the output of the charge pump 102 is higher than a desired output, the charge pump 102 may be idle and is set into a sleep mode. In other embodiments, the charge pump 102 may have other suitable operations.

In certain embodiments, the charge pump 102 transforms from one mode to another mode in response to the instantaneous value of the input signal. However, in other embodiments, the charge pump 102 may transform from one mode to another mode in response to the amplitude of the input value.

Figure 14:
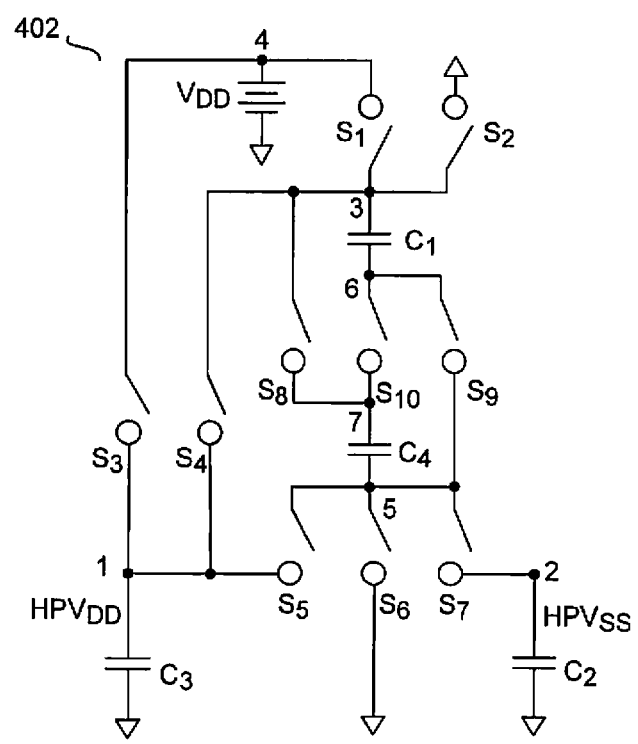
FIG. 14 illustrates a charge pump suitable for providing output signals shown in FIG. 13 in accordance with embodiments of the technology.

FIG. 14 illustrates a charge pump 402 suitable for realizing output signals shown in FIG. 13 in accordance with further embodiments of the technology. In one embodiment, N=3, and the single fly capacitor ($C_1$) is replaced by two capacitors, i.e., a first fly capacitor ($C_1$) and a second capacitor ($C_4$). The charge pump 402 comprises switches ($S_1$~$S_{10}$), the first fly capacitor ($C_1$), a negative power capacitor ($C_2$), a positive power capacitor ($C_3$), the second fly capacitor ($C_4$), an power supply ($V_{DD}$), and nodes 1~7.

In contrast to the charge pump 202 in FIG. 7, there are two more nodes 6 and 7 between node 3 and node 5. The first fly capacitor ($C_1$) is coupled between node 3 and node 6; the second fly capacitor ($C_4$) is coupled between node 5 and node 7; an eighth switch ($S_5$) is coupled between node 3 and node 7; a ninth switch ($S_9$) is coupled between node 5 and node 6; a tenth switch ($S_{10}$) is coupled between node 6 and node 7. The rest of the charge pump 402 is generally similar to that of the charge pump 202. Different power supplies could be provided at node 1 and node 2 when different control schemes are adopted.

Figure 15:
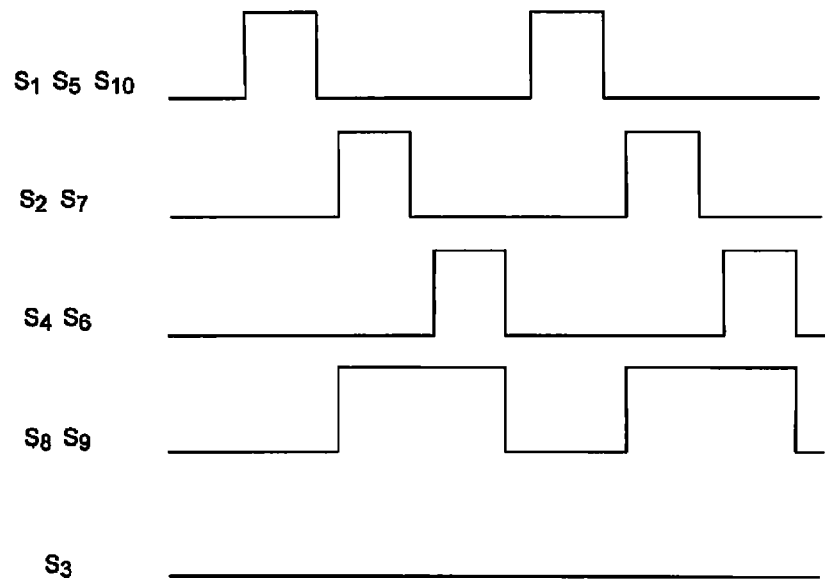
FIG. 15 illustrates switch control signals when the charge pump in FIG. 14 operates under ±⅓× mode.

FIG. 15 illustrates switch control signals when the charge pump 402 in FIG. 14 operates under ±⅓× mode. As shown in FIG. 15, the control signals of the first switch ($S_1$) to the tenth switch ($S_{10}$) are as follows: Operation 1, turn on the first switch ($S_1$), the fifth switch ($S_5$) and the tenth switch ($S_{10}$), and turn off the rest of the switches. The power supply ($V_{DD}$), the first switch ($S_1$), the first fly capacitor ($C_1$), the tenth switch ($S_{10}$), the second fly capacitor ($C_4$), the fifth switch ($S_5$), and the positive power capacitor ($C_3$) form a current loop. The voltage across the first fly capacitor ($C_1$) is charged to be $V_{C1}$, the voltage across the positive power capacitor ($C_3$) is charged to be $V_{C3}$, the voltage across the second fly capacitor ($C_4$) is charged to be $V_{C4}$, and $V_{C1}$+$V_{C3}$+$V_{C4}$=$V_{DD}$. The voltage across the positive capacitor ($C_3$) is positive, i.e., $HPV_{DD}$=$V_{C3}$.

Operation 2, turn on the second switch ($S_2$), the seventh switch ($S_7$), the eighth switch ($S_8$) and the ninth switch ($S_9$), and turn off the rest of the switches. The second switch ($S_2$), the eighth switch ($S_8$), the second fly capacitor ($C_4$), the seventh switch ($S_7$), and the negative power capacitor ($C_2$) form a current loop. Meanwhile, the second switch ($S_2$), the first fly capacitor ($C_1$), the ninth switch ($S_9$), the seventh switch ($S_7$), and the negative power capacitor ($C_2$) also form a current loop. The first fly capacitor ($C_1$), the second fly capacitor ($C_4$) and the negative power capacitor ($C_2$) are coupled in parallel. The first fly capacitor ($C_1$) and the second fly capacitor ($C_4$) are discharged by the negative capacitor ($C_2$). Accordingly, the voltage across the negative power capacitor ($C_2$) is $V_{C2}$=$V_{C1}$=$V_{C4}$. And the voltage across the negative capacitor ($C_2$) is negative, i.e., $HPV_{SS}$=−$V_{C1}$.

Operation 3, turn on the fourth switch ($S_4$), the sixth switch ($S_6$), the eighth switch ($S_8$) and the ninth switch ($S_9$), and turn off the rest of the switches. The sixth switch ($S_6$), the ninth switch ($S_9$), the first fly capacitor ($C_1$), the fourth switch ($S_4$), and the positive power capacitor ($C_3$) form a current loop. Meanwhile, the sixth switch ($S_6$), the second fly capacitor ($C_4$), the eighth switch ($S_8$), the fourth switch ($S_4$), and the positive power capacitor ($C_3$) also form a current loop. The first fly capacitor ($C_1$), the second fly capacitor ($C_4$), and the positive power capacitor ($C_3$) are coupled in parallel. Accordingly, the voltage across the positive power capacitor ($C_3$) is $V_{C3}$=$V_{C1}$=$V_{C4}$. As illustrated above, $V_{C1}$+$V_{C3}$+$V_{C4}$=$V_{DD}$. Thus, $V_{C1}$=$V_{C3}$=$V_{C4}$=½$V_{DD}$, $HPV_{DD}$=$V_{C3}$=+⅓$V_{DD}$, $HPV_{SS}$=−$V_{C1}$=−⅓$V_{DD}$. The process repeats by executing the three Operations above to provide stable $HPV_{DD}$=+⅓$V_{DD}$, $HPV_{SS}$=−⅓$V_{DD}$, realizing the ±⅓× mode.

Figure 16:
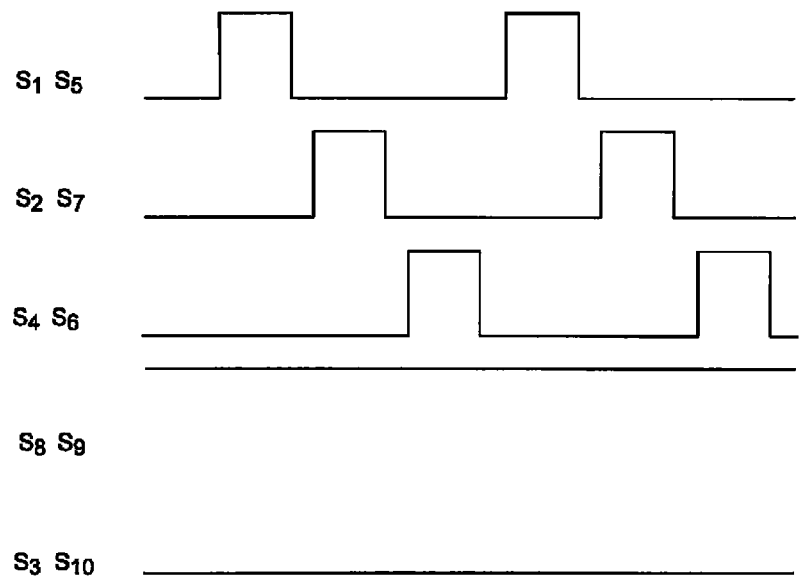
FIG. 16 illustrates switch control signals when the charge pump in FIG. 14 operates under ±½× mode.

FIG. 16 illustrates switch control signals when the charge pump 402 in FIG. 14 operates under ±0.5× mode. As shown in FIG. 16, the control signals of the first switch ($S_1$) to the tenth switch ($S_{10}$) are as follows: Operation 1, turn on the first switch ($S_1$), the fifth switch ($S_5$), the eighth switch ($S_8$) and the ninth switch ($S_9$), and turn off the rest of the switches. The power supply ($V_{DD}$), the first switch ($S_1$), the first fly capacitor ($C_1$), the ninth switch ($S_9$), the fifth switch ($S_5$); and the positive power capacitor ($C_3$) form a current loop. Meanwhile, the power supply ($V_{DD}$), the first switch ($S_1$), the eighth switch ($S_5$), the second fly capacitor ($C_4$), the fifth switch ($S_5$), and the positive power capacitor ($C_3$) also form a current loop. The first fly capacitor ($C_1$) and the second fly capacitor ($C_4$) are coupled in parallel, which is further coupled with the negative power capacitor ($C_2$) in series between the power supply ($V_{DD}$) and ground. The voltage across the first fly capacitor ($C_1$) is charged to be $V_{C1}$, the voltage across the second fly capacitor ($C_4$) is charged to be $V_{C4}$, and the voltage across the positive power capacitor ($C_3$) is charged to be $V_{C3}$, wherein $V_{C1}$=$V_{C4}$, $V_{C1}$+$V_{C3}$=$V_{DD}$. And the voltage across the positive capacitor ($C_3$) is positive, i.e., $HPV_{DD}$=$V_{C3}$.

Operation 2, turn on the second switch ($S_2$) and the seventh switch ($S_7$), keep the eighth switch ($S_8$) and the ninth switch ($S_9$) ON, and turn off the rest of the switches. The second switch ($S_2$), eighth switch ($S_5$), the second fly capacitor ($C_4$), the seventh switch ($S_7$), and the negative power capacitor ($C_2$) form a current loop. Meanwhile, the second switch ($S_2$), the first fly capacitor ($C_1$), the ninth switch ($S_9$), the seventh switch ($S_7$), and the negative power capacitor ($C_2$) also form a current loop. The first fly capacitor ($C_1$), the second fly capacitor ($C_4$) and the negative power capacitor ($C_2$) are coupled in parallel. The first fly capacitor ($C_1$) and second fly capacitor ($C_4$) are discharged by the negative capacitor ($C_2$). Accordingly, the voltage across the negative power capacitor ($C_2$) is $V_{C2}$=$V_{C1}$=$V_{C4}$. And the voltage across the negative capacitor ($C_2$) is negative, i.e., $HPV_{SS}$=−$V_{C1}$.

Operation 3, turn on the fourth switch ($S_4$) and the sixth switch ($S_6$), keep the eighth switch ($S_8$) and the ninth switch ($S_9$) ON, and turn off the rest of the switches. The sixth switch ($S_6$), the ninth switch ($S_9$), the first fly capacitor ($C_1$), the fourth switch ($S_4$), and the positive power capacitor ($C_3$) form a current loop. Meanwhile, the sixth switch ($S_6$), the second fly capacitor ($C_4$), the eighth switch ($S_8$), the fourth switch ($S_4$), and the positive power capacitor ($C_3$) also form a current loop. The first fly capacitor ($C_1$), the second fly capacitor ($C_4$) and the positive power capacitor ($C_3$) are coupled in parallel. Accordingly, the voltages across the positive power capacitor ($C_3$) is $V_{C3}=V_{C1}=V_{C4}$. As illustrated above, $V_{C1}+V_{C3}=V_{DD}$, so $V_{C1}=V_{C3}=V_{C4}=\frac{1}{2}V_{DD}$, $HPV_{DD}=V_{C3}=+\frac{1}{2}V_{DD}$, $HPV_{SS}=-V_{C1}=-\frac{1}{2}V_{DD}$. The process repeats by executing the three Operations above to provide stable $HPV_{DD}=+\frac{1}{2}V_{DD}$, $HPV_{SS}=-\frac{1}{2}V_{DD}$, realizing the $\pm\frac{1}{2}\times$ mode.

Figure 17:
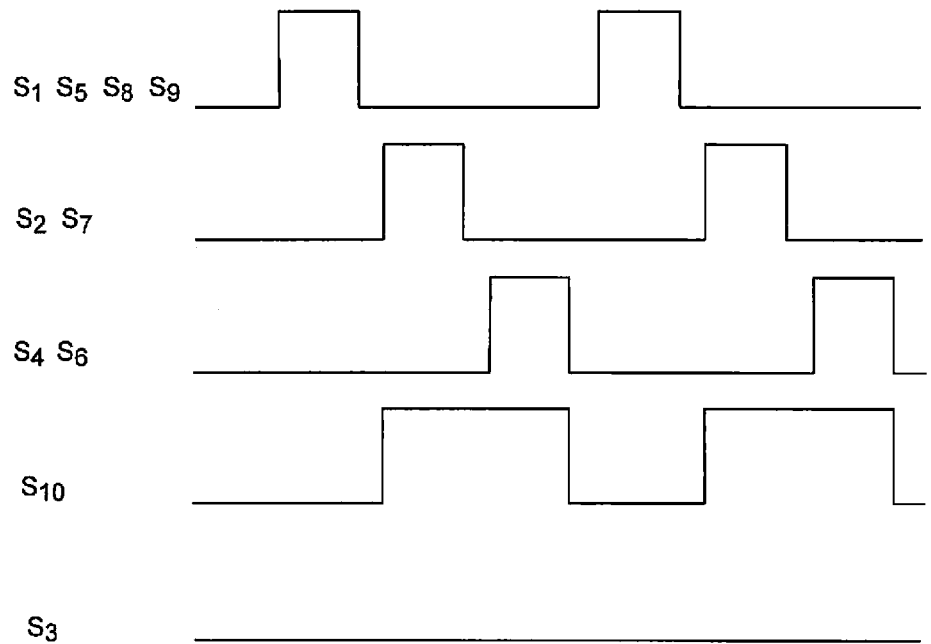
FIG. 17 illustrates switch control signals when the charge pump in FIG. 14 operates under ±⅔× mode.

FIG. 17 illustrates switch control signals when the charge pump 402 in FIG. 14 operates under $\pm\frac{2}{3}\times$ mode. As shown in FIG. 17, the control signals of the first switch ($S_1$) to the tenth switch ($S_{10}$) are as follows: Operation 1, turn on the first switch ($S_1$), the fifth switch ($S_5$), the eighth switch ($S_8$) and the ninth switch ($S_9$), and turn off the rest of the switches. The power supply ($V_{DD}$), the first switch ($S_1$), the first fly capacitor ($C_1$), the ninth switch ($S_9$), the fifth switch ($S_5$), and the positive power capacitor ($C_3$) form a current loop. Meanwhile, the power supply ($V_{DD}$), the first switch ($S_1$), the eighth switch ($S_9$), the second fly capacitor ($C_4$), the fifth switch ($S_5$), and the positive power capacitor ($C_3$) also form a current loop. The first fly capacitor ($C_1$) and the second fly capacitor ($C_4$) are coupled in parallel, which is further coupled with the positive power capacitor ($C_3$) in series between the power supply ($V_{DD}$) and ground. The voltage across the fly capacitor ($C_1$) is charged to be $V_{C1}$, the voltage across the second fly capacitor (C4) is charged to be $V_{C4}$, the voltage across the positive power capacitor ($C_3$) is charged to be $V_{C3}$, wherein $V_{C1}=V_{C4}$, $V_{C1}+V_{C3}=V_{DD}$. And the voltage across the positive capacitor ($C_3$) is positive, i.e., $HPV_{DD}=+V_{C3}$.

Operation 2, turn on the second switch ($S_2$), the seventh switch ($S_7$) and the tenth switch ($S_{10}$), and turn off the rest of the switches. The second switch ($S_2$), the first fly capacitor ($C_1$), the tenth switch ($S_{10}$), the second fly capacitor ($C_4$), the seventh switch ($S_7$), and the negative power capacitor ($C_2$) form a current loop. The first fly capacitor ($C_1$) and the second fly capacitor ($C_4$) are coupled in series, which is further coupled with the negative power capacitor ($C_2$) in parallel. The first fly capacitor ($C_1$) and the second fly capacitor ($C_4$) are discharged by the negative capacitor ($C_2$). Accordingly, the voltage across the negative power capacitor ($C_2$) is $V_{C2}=V_{C1}+V_{C4}$. And the voltage across the negative capacitor ($C_2$) is positive, i.e., $HPV_{SS}=-V_{C2}$.

Operation 3, turn on the fourth switch ($S_4$), the sixth switch ($S_6$) and the tenth switch ($S_{10}$), and turn off the rest of the switches. The sixth switch ($S_6$), second fly capacitor ($C_4$), the tenth switch ($S_{10}$), the first fly capacitor ($C_1$), the fourth switch ($S_4$), and the positive power capacitor ($C_3$) form a current loop. The first fly capacitor ($C_1$) the second fly capacitor ($C_4$) are coupled in series, which is further coupled with the positive power capacitor ($C_3$) in parallel. Accordingly, the voltage across the positive power capacitor ($C_3$) is $V_{C3}=V_{C1}+V_{C4}$. As illustrated hereinbefore, $V_{C1}=V_{C4}$, $V_{C1}+V_{C3}=V_{DD}$, so $V_{C1}=V_{C4}=+\frac{1}{3}V_{DD}$, $V_{C3}=+\frac{2}{3}V_{DD}$, $V_{C2}=+\frac{2}{3}V_{DD}$, $HPV_{DD}=V_{C3}=+\frac{2}{3}V_{DD}$, $HPV_{SS}=-\frac{2}{3}V_{DD}$. The process repeats by executing the three Operations above to provide stable $HPV_{DD}=+\frac{2}{3}V_{DD}$, $HPV_{SS}=-\frac{2}{3}V_{DD}$, realizing the $\pm\frac{2}{3}\times$ mode.

Figure 18:
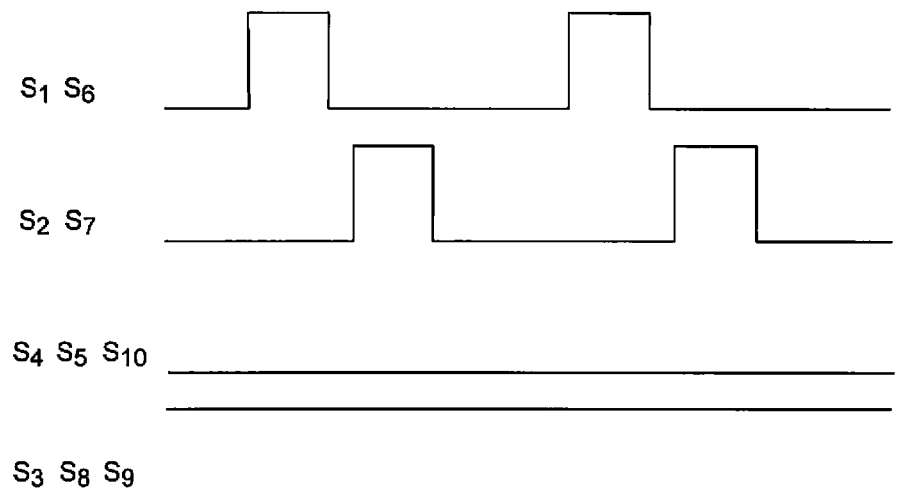
FIG. 18 illustrates switch control signals when the charge pump in FIG. 14 operates under ±1× mode.

FIG. 18 illustrates switch control signals when the charge pump 402 in FIG. 14 operates under $\pm1\times$ mode. As shown in FIG. 18, the control signals of the first switch ($S_1$) to the tenth switch ($S_{10}$) are as follows: Operation 1, turn on the first switch ($S_1$), the sixth switch ($S_6$), the third switch ($S_3$), the eighth switch ($S_8$) and the ninth switch ($S_9$), and turn off the rest of the switches. As a result, the positive power capacitor ($C_3$) is charged by the power supply ($V_{DD}$), i.e., $HPV_{DD}=+V_{DD}$. The power supply ($V_{DD}$), the first switch ($S_1$), the first fly capacitor ($C_1$), the ninth switch ($S_9$), and the sixth switch ($S_6$) form a current loop. Meanwhile, the power supply ($V_{DD}$), the first switch ($S_1$), the eighth switch ($S_8$), the second fly capacitor ($C_4$), and the sixth switch ($S_6$) also form a current loop. The first fly capacitor ($C_1$) and the second fly capacitor ($C_4$) are coupled in parallel between the power supply ($V_{DD}$) and ground. So the voltages across the fly capacitor ($C_1$) and the second fly capacitor ($C_4$) are charged to be $V_{DD}$.

Operation 2, turn on the second switch ($S_2$) and the seventh switch ($S_7$), keep the third switch ($S_3$), the eighth switch ($S_8$), and the ninth switch ($S_9$) on, and turn off the rest of the switches. The positive power capacitor ($C_3$) is continued to be charged by the power supply ($V_{DD}$). The second switch ($S_2$), the first fly capacitor (CA the ninth switch ($S_9$), the seventh switch ($S_7$), and the negative power capacitor ($C_2$) form a current loop. Meanwhile, the second switch ($S_2$), the eighth switch ($S_8$), the second fly capacitor ($C_4$), the seventh switch ($S_7$), and the negative power capacitor ($C_2$) also form a current loop. The first fly capacitor ($C_1$), the second fly capacitor ($C_4$) and the negative power capacitor ($C_2$) are coupled in parallel. The first fly capacitor ($C_1$) and the second fly capacitor ($C_4$) are discharged by the negative capacitor ($C_2$). Accordingly, the voltage across the negative power capacitor ($C_2$) is $V_{C2}=V_{C1}=V_{C4}=-V_{DD}$. And the voltage across the negative capacitor ($C_2$) is negative, i.e., $HPV_{SS}=-V_{DD}$. The process repeats by executing the two Operations above, so that stable $HPV_{DD}=+V_{DD}$, $HPV_{SS}=-V_{DD}$ are provided, and the $\pm1\times$ mode is realized.

As illustrated hereinbefore, the first switch ($S_1$) and the third switch ($S_3$) are operated in ON/OFF mode. However, in other embodiments, the first switch ($S_1$) and the third switch ($S_3$) may operate as a controllable current source. The switch control signals illustrated hereinbefore are in voltage domain. However, in other embodiments the switch control signals may be illustrated in current domain.

Furthermore, the present technology provides a method for operating a class G audio amplifier. In one embodiment, the method comprises detecting an input signal through a level detector to obtain a detected level signal; providing a positive power supply and a negative power supply through a charge pump in response to the detected level signal; and providing an amplified audio signal through an audio output stage in response to the input signal, the positive power supply, and the negative power supply.

In one embodiment, the positive power supply and the negative power supply have the same amplitude but with opposite polarities from each other. The positive power supply and the negative power supply can be $\pm V_{DD}/N$, $\pm 2*V_{DD}/N$, $\pm 3*V_{DD}/N$, ..., $\pm(N-2)*V_{DD}/N$, $\pm(N-1)*V_{DD}/N$, $\pm V_{DD}$, where $V_{DD}$ is the voltage value of a power supply, N is a natural number. In certain embodiments, the amplitude of the input signal is detected to obtain the level detected signal. In other embodiments, the instantaneous value of the input signal is detected to obtain the level detected signal.

The charge pump can include a power supply, a positive power capacitor, a negative power capacitor and a fly capacitor. The positive power capacitor is coupled between a positive output of the charge pump and ground; the negative power capacitor is coupled between a negative output of the charge pump and ground; the fly capacitor is controllable to be coupled between the power supply and the negative output of the charge pump or to coupled between the power supply and the positive output of the charge pump.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

We claim:

1. A class G audio amplifier, comprising:
   an input port configured to receive an input signal;
   an audio output stage coupled to the input port, wherein the audio output stage is configured to output an amplified audio signal that is based on the input signal;
   a level detector coupled to the input port, wherein the level detector is configured to detect a level of the input signal and to output a detected level signal based on the detected level of the input signal; and
   a charge pump coupled to the level detector, wherein the charge pump is configured to provide a positive power supply voltage and a negative power supply voltage in response to the detected level signal, the positive power supply and the negative power supply being coupled to power the audio output stage, and wherein the charge pump comprises:
     a power supply coupled to a positive output of the charge pump via a third switch;
     a positive power capacitor coupled between the positive output of the charge pump and ground;
     a negative power capacitor coupled between a negative output of the charge pump and ground;
     a first fly capacitor having a first terminal and a second terminal, wherein the first terminal is controllably coupled to the power supply via a first switch, the first terminal is also controllably coupled to the positive output of the charge pump via a fourth switch, and the first terminal is also controllably coupled to ground via a second switch;
     a second fly capacitor having a first and a second terminal, wherein the first terminal is controllably coupled to the first terminal of the first fly capacitor via an eighth switch, and the first terminal is also coupled to the second terminal of the first fly capacitor via a tenth switch; and
     the second terminal is controllably coupled to: (i) the positive output of the charge pump via a fifth switch; (ii) ground via a sixth switch; (iii) the second terminal of the first fly capacitor via a ninth switch; and (iv) the negative output of the charge pump via a seventh switch.

2. The class G audio amplifier of claim 1, further comprising a speaker coupled to an output of the audio output stage.

3. The class G audio amplifier of claim 1, wherein the level detector detects an instantaneous voltage level of the input signal.

4. The class G audio amplifier of claim 1, wherein the level detector detects an amplitude of the input signal.

5. The class G audio amplifier of claim 1, wherein the positive power supply and the negative power supply have the same amplitude but opposite polarities from each other.

6. The class G audio amplifier of claim 1, wherein the charge pump is configured to operate at $\pm\frac{1}{3}\times$, $\pm\frac{2}{3}\times$, $\pm\frac{1}{2}\times$, and $\pm 1\times$ mode.

7. The class G audio amplifier of claim 1, wherein during a transition from a high mode to a low mode, if an output of the charge pump is higher than a desired value, the charge pump is in a sleep mode.

8. The class G audio amplifier of claim 1, wherein the first switch and the third switch operate as a controllable current source.

9. The class G audio amplifier of claim 1, wherein the fifth switch includes a diode.

10. The class G audio amplifier of claim 1, wherein the seventh switch includes diode.

11. A class G audio amplifier, comprising:
    an input port for receiving an input signal;
    means for providing an amplified audio signal in response to the input signal;
    means for detecting a level of the input signal, and providing a detected level signal based on the detected level of the input signal;
    means for providing a positive power supply and a negative power supply in response to the detected level signal, wherein the positive power supply and the negative power supply are coupled to power the means for providing the amplified audio signal, wherein means for providing a positive power supply and a negative power supply is a charge pump comprising:
      a power supply coupled to a positive output of the charge pump via a third switch;
      a positive power capacitor coupled between the positive output of the charge pump and ground;
      a negative power capacitor coupled between a negative output of the charge pump and ground; and
      a fly capacitor having:
        a first terminal controllably coupled to the power supply via a first switch, coupled to the positive output of the charge pump via a fourth switch, and coupled to ground via a second switch; and
        a second terminal controllably coupled to the positive output of the charge pump via a fifth switch, coupled to the negative output of the charge pump via a seventh switch, and coupled to ground via a sixth switch;
      wherein the charge pump has a high operation mode, a low operation mode and a sleep mode, and wherein during a transition from the high operation mode to the low operation mode, if an output of the charge pump is higher than a desired value, the charge pump is in the sleep mode.

12. The class G audio amplifier of claim 11, wherein the means for detecting the input signal detect an instantaneous voltage of the input signal.

13. The class G audio amplifier of claim 11, wherein the means for detecting the input signal detect an amplitude of the input signal.

14. The class G audio amplifier of claim 11, wherein the positive power supply and the negative power supply have the same amplitude but opposite polarities from each other.

15. The class G audio amplifier of claim 11, wherein the low operation mode is $\pm\frac{1}{2}\times$ and the high operation mode is $\pm 1\times$ mode.

* * * * *